(12) United States Patent
Yang

(10) Patent No.: US 11,735,472 B2
(45) Date of Patent: Aug. 22, 2023

(54) METHOD OF PREPARING AIR GAP, DYNAMIC RANDOM ACCESS MEMORY AND ELECTRONIC EQUIPMENT

(71) Applicant: CHANGXIN MEMORY TECHNOLOGIES, INC., Hefei (CN)

(72) Inventor: Lei Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 175 days.

(21) Appl. No.: 17/603,796

(22) PCT Filed: Jul. 7, 2021

(86) PCT No.: PCT/CN2021/105004
§ 371 (c)(1),
(2) Date: Oct. 14, 2021

(87) PCT Pub. No.: WO2023/272769
PCT Pub. Date: Jan. 5, 2023

(65) Prior Publication Data
US 2023/0123510 A1 Apr. 20, 2023

(30) Foreign Application Priority Data
Jul. 2, 2021 (CN) .......................... 202110748687.7

(51) Int. Cl.
| | |
|---|---|
| *H01L 21/768* | (2006.01) |
| *H10B 12/00* | (2023.01) |
| *H01L 21/311* | (2006.01) |
| *H01L 21/3213* | (2006.01) |
| *H01L 23/522* | (2006.01) |

(Continued)

(52) U.S. Cl.
CPC .... *H01L 21/7682* (2013.01); *H01L 21/31111* (2013.01); *H01L 21/31144* (2013.01); *H01L 21/32135* (2013.01); *H01L 23/5222* (2013.01); *H01L 23/5283* (2013.01);
(Continued)

(58) Field of Classification Search
CPC ........... H01L 21/7682; H01L 21/31111; H01L 21/31144; H01L 21/32135; H01L 23/5222; H01L 23/5283; H01L 21/3212; H01L 21/764; H01L 21/76897; H10B 12/02; H10B 12/482; H10B 12/488
See application file for complete search history.

(56) References Cited

U.S. PATENT DOCUMENTS

| | | | |
|---|---|---|---|
| 9,515,022 B2 | 12/2016 | Kwon et al. | |
| 10,453,796 B2 | 10/2019 | Song et al. | |

(Continued)

FOREIGN PATENT DOCUMENTS

| | | |
|---|---|---|
| CN | 108206184 A | 6/2018 |
| CN | 108777253 A | 11/2018 |

*Primary Examiner* — Karen Kusumakar
(74) *Attorney, Agent, or Firm* — Syncoda LLC; Feng Ma

(57) ABSTRACT

A method of preparing an air gap includes: forming a first covering layer etching and removing part higher than a horizontal line where a top of the oxide layer is located; forming a first oxide layer on an etched plane; etching the first oxide layer; removing a part of the first oxide layer; reserving a rest part of the first oxide layer; taking a reserved first oxide layer as an oxide layer pattern; forming a second covering layer at a position of a removed part of the first oxide layer; removing the oxide layer pattern and the oxide layer.

19 Claims, 12 Drawing Sheets

(51) Int. Cl.
*H01L 23/528* (2006.01)
*H01L 21/321* (2006.01)

(52) U.S. Cl.
CPC ........... *H10B 12/02* (2023.02); *H10B 12/482* (2023.02); *H01L 21/3212* (2013.01); *H10B 12/488* (2023.02)

(56) References Cited

U.S. PATENT DOCUMENTS

| | | |
|---|---|---|
| 2015/0126013 A1 | 5/2015 | Hwang et al. |
| 2016/0276273 A1* | 9/2016 | Kwon ................... H10B 12/053 |
| 2018/0226290 A1* | 8/2018 | Lee .................... H01L 21/31111 |
| 2021/0066304 A1* | 3/2021 | Kang ................. H10B 12/0335 |
| 2021/0134804 A1* | 5/2021 | Jung ....................... H01L 28/75 |

* cited by examiner

METHOD OF PREPARING AIR GAP, DYNAMIC RANDOM ACCESS MEMORY AND ELECTRONIC EQUIPMENT

CROSS-REFERENCE TO RELATED APPLICATIONS

This application is a national stage of International Application No. PCT/CN2021/105004 filed on Jul. 7, 2021, which claims priority to Chinese Patent Application No. 202110748687.7, filed on Jul. 2, 2021. The disclosures of these applications are hereby which is incorporated herein by reference in its-their entirety.

TECHNICAL FIELD

This present application relates to semiconductor production field, particular to a method of preparing an air gap, a dynamic random access memory and an electronic equipment.

BACKGROUND

Dynamic Random Access Memory (DRAM) is composed of multiple memory cells, and each memory cell is composed of a storage capacitor, a transistor, a bit line and a word line. The voltage $V_{BL}$ of the bit line is inversely proportional to the capacitance $C_{BL}$ of the bit line. In order to increase the value of the voltage $V_{BL}$, the value of the capacitance $C_{BL}$ needs to be reduced. The parasitic capacitance formed between the bit line and the storage capacitor accounts for more than 60% of the $C_{BL}$. The parasitic capacitance is usually improved by improving the relative dielectric constant, and the air is used to replace the oxide layer on the sidewall of the bit line.

In related prior art, when preparing an air gap, after metal deposition is performed on the top of the oxide layer, the oxide layer is directly etched from the top of the deposited metal downward. The air gap is formed at the position of the oxide layer, and the oxide layer is replaced by the air gap. However, in the deposition process, a layer of titanium nitride is formed on the contact surface between the top of the oxide layer and the deposited metal, which is easy to cause the landing pad bridge during etching process, and if excessive etching occurs, it is easy to cause the landing pad necking.

SUMMARY

In a first aspect, an embodiment of the present application provides a method of preparing an air gap being applied to a dynamic random access memory; where the dynamic random access memory includes: a semiconductor substrate with a bit line and a word line, a first bit line interval layer arranged on both sidewalls of the bit line, an oxide layer arranged on a sidewall of the first bit line interval layer, and an insulating layer arranged on a top of the bit line; a node contact layer is arranged on a the surface of the semiconductor substrate; the dynamic random access memory further includes a second bit line interval layer, and the oxide layer is located between the first bit line interval layer and the second bit line interval layer;

the method of preparing an air gap includes:

forming a first covering layer on an upper surface of the node contact layer, a top of the first bit line interval layer, a top of the second bit line interval layer, a top of the oxide layer, and an upper surface of the insulating layer; and forming a thin film layer on a lower surface of the first covering layer;

polishing the first covering layer to be flush with an upper surface of the thin film layer on a top of the insulating layer; then etching and removing part higher than a horizontal line where a top of the oxide layer is located, so as to expose the top of the oxide layer;

forming a first oxide layer on an etched plane;

etching the first oxide layer; removing a part of the first oxide layer, the part of the first oxide layer being on a top of the oxide layer on a first side of each bit line, a top of the first bit line interval layer on a first side of each bit line, and a top of a second bit line interval layer on a first side of each bit line; reserving a rest part of the first oxide layer, the rest part of the first oxide layer being on a top of the oxide layer on a second side of each bit line, a top of the first bit line interval layer on a second side of each bit line, and a top of the second bit line interval layer on a second side of each bit line; taking a reserved first oxide layer as an oxide layer pattern;

forming a second covering layer at a position of a removed part of the first oxide layer, an upper surface of the second covering layer being flush with an upper surface of the oxide layer pattern;

removing the oxide layer pattern and the oxide layer to form an air gap at a position of the oxide layer.

In a second aspect, an embodiment of the present application provides a dynamic random access memory. The dynamic random access memory is a semiconductor structure manufactured according to the method of preparing an air gap provided by the embodiment of the present application.

In a third aspect, an embodiment of the present application provides an electronic equipment, including the dynamic random access memory provided in the embodiment of the present application.

The embodiments of the present application at least have the following advantages.

The embodiments of the present application provide a method of preparing an air gap, being applied to a dynamic random access memory; the dynamic random access memory includes: a semiconductor substrate with a bit line and a word line, a first bit line interval layer arranged on both sidewalls of the bit line, an oxide layer arranged on a sidewall of the first bit line interval layer, and an insulating layer arranged on a top of the bit line; a node contact layer is arranged on the surface of the semiconductor substrate; the dynamic random access memory further includes a second bit line interval layer, and the oxide layer is located between the first bit line interval layer and the second bit line interval layer. When preparing the air gap, a first covering layer is formed on an upper surface of the node contact layer, a top of the first bit line interval layer, a top of the second bit line interval layer, a top of the oxide layer, and an upper surface of the insulating layer; and a thin film layer is formed on a lower surface of the first covering layer; the first covering layer is polished to be flush with an upper surface of the thin film layer on a top of the insulating layer; then the part higher than a horizontal line is etched and removed, a position of a top of the oxide layer being taken as the horizontal line, so as to expose the top of the oxide layer. Furthermore, a first oxide layer is formed on an etched plane, the first oxide layer is etched; a part of the first oxide layer located on a top of the oxide layer on one side of the bit line is removed, a rest part of the first oxide layer located on a top of the oxide layer on another side of the bit line is reserved, and the reserved part of the first oxide layer is taken as an oxide layer pattern. Furthermore, a second covering layer is formed at a position of a removed part of the first oxide layer, the upper surface of the second covering layer is flush with the upper surface of the oxide layer pattern; the position of the removed part of the first oxide layer is filled with the second covering layer, and the oxide layer pattern and the oxide layer are removed, an air gap is formed at a position of the oxide layer to replace the oxide layer. In some embodiments of the present application, an oxide layer pattern is formed on the top of the first bit line interval layer on one side of the bit line, on the top of the oxide layer on the same one side of the bit line, and on the top of the second bit line interval layer on the same one side of the bit line, and the second covering layer is formed between the oxide layer patterns. The finally formed second covering layer and the finally formed first covering layer are defined as a landing pad. The oxide layer pattern separates the adjacent landing pads, avoiding the problem of short-circuit caused by the landing pad bridge when the air gap is prepared, since the width of the landing pad can be reduced at the same time, the problem of the landing pad necking is avoided.

Other features and advantages of the present application will be described in the following description, and partly become obvious from the description, or understood by the embodiments the present application. The purpose and other advantages of the present application can be realized and obtained by the structure specified in the description, claims, and drawings.

BRIEF DESCRIPTION OF THE DRAWINGS

The drawings described here are used to provide a further understanding of the present application and constitute a part of the present application. The embodiments and descriptions of the present application are used to explain the present application and do not constitute an improper limitation of the present application. In the drawings.

DETAILED DESCRIPTION

Figure 1:
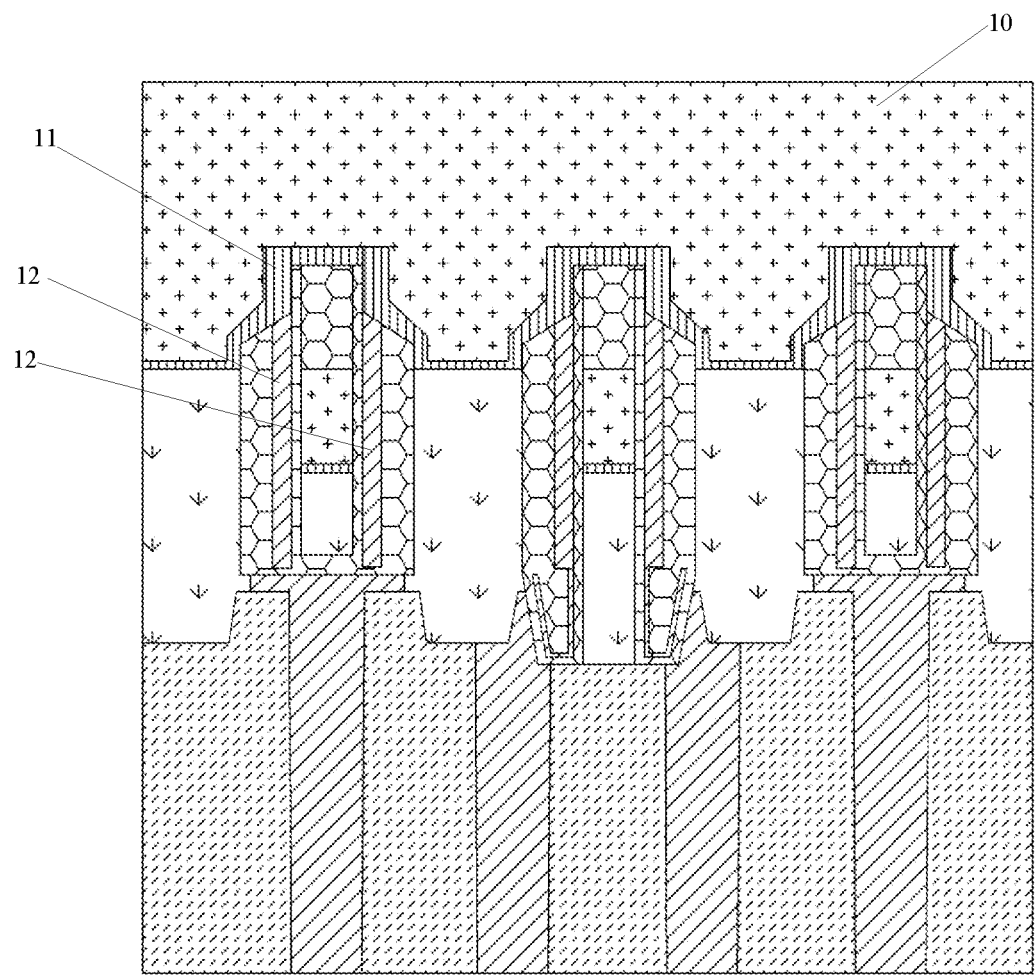
FIG. 1 is a sectional diagram of the corresponding dynamic random access memory structure after metal deposition on the top of the oxide layer before removing the oxide layer in the dynamic random access memory.
Figure 2:
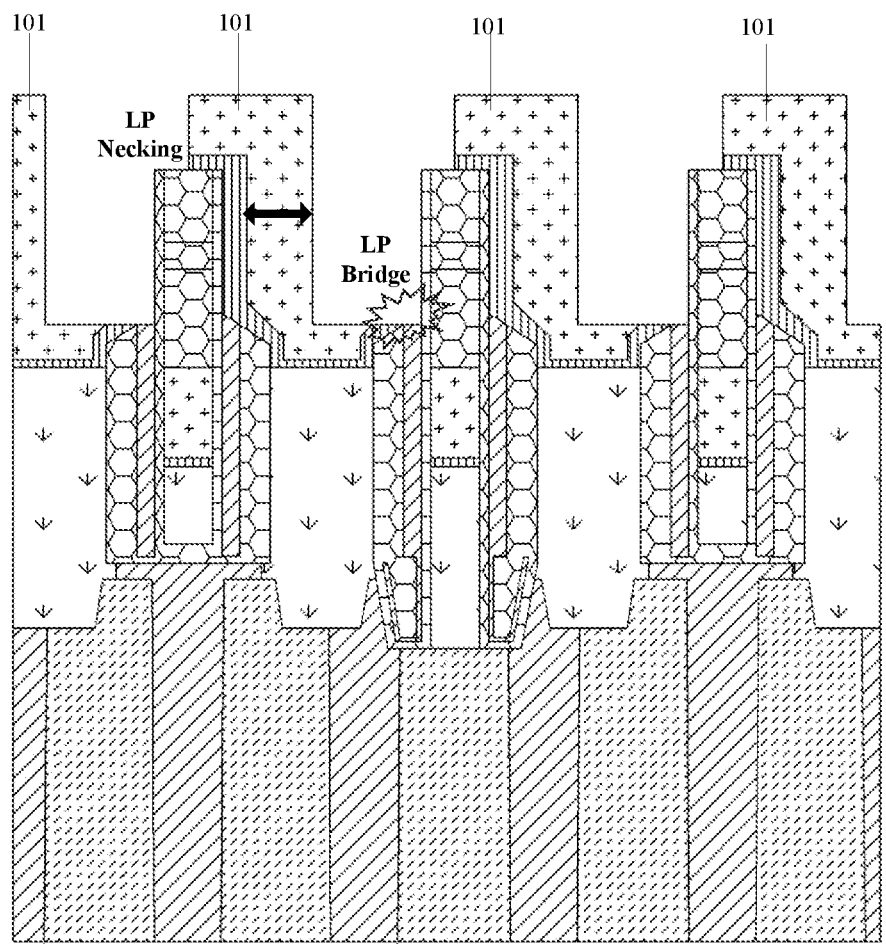
FIG. 2 is a sectional diagram of the corresponding dynamic random access memory structure when the oxide layer is removed in the prior art.

When preparing the air gap on both sides of the bit line in the existing dynamic random access memory, after metal deposition on the top of the oxide layer, directly etch from the top of the deposited metal downward to form a landing pad, and then the oxide layer is removed. The air gap is formed at the position of the oxide layer, and the oxide layer is replaced by the air gap. However, in the deposition process, a layer of titanium nitride (refer to 11 in FIG. 1) will be formed at the contact surface between the top of the oxide layer and the deposited metal (the metal can be tungsten, refer to 10 in FIG. 1). When removing the oxide layer (refer to 12 in FIG. 1), in the prior art, the oxide layer is directly etched from the upper surface of the deposited metal downward, to form a landing pad, and then the oxide layer is removed to form an air gap, the air gap replaces the oxide layer. As shown in FIG. 2, after the etching is completed, the titanium nitride is still in contact with the top of the oxide layer on the side of the bit line, so that it is easy to cause the landing pad 101 bridge (refer to the LP Bridge marked in FIG. 2), and if the etching is excessive, it is easy to cause the problem of the landing pad 101 necking (refer to the LP Necking marked in FIG. 2). In order to solve the above problems, the embodiments of the present application provide a method of preparing an air gap, a dynamic random access memory, and an electronic equipment.

The embodiments of the present application are described below with reference to the drawings of the specification. It should be understood that the embodiments described here are only used to illustrate and explain the present application, and are not used to limit the present application, and in the case of no conflict, the embodiments of the present application and the features of the embodiments can be combined with each other.

Figure 3:
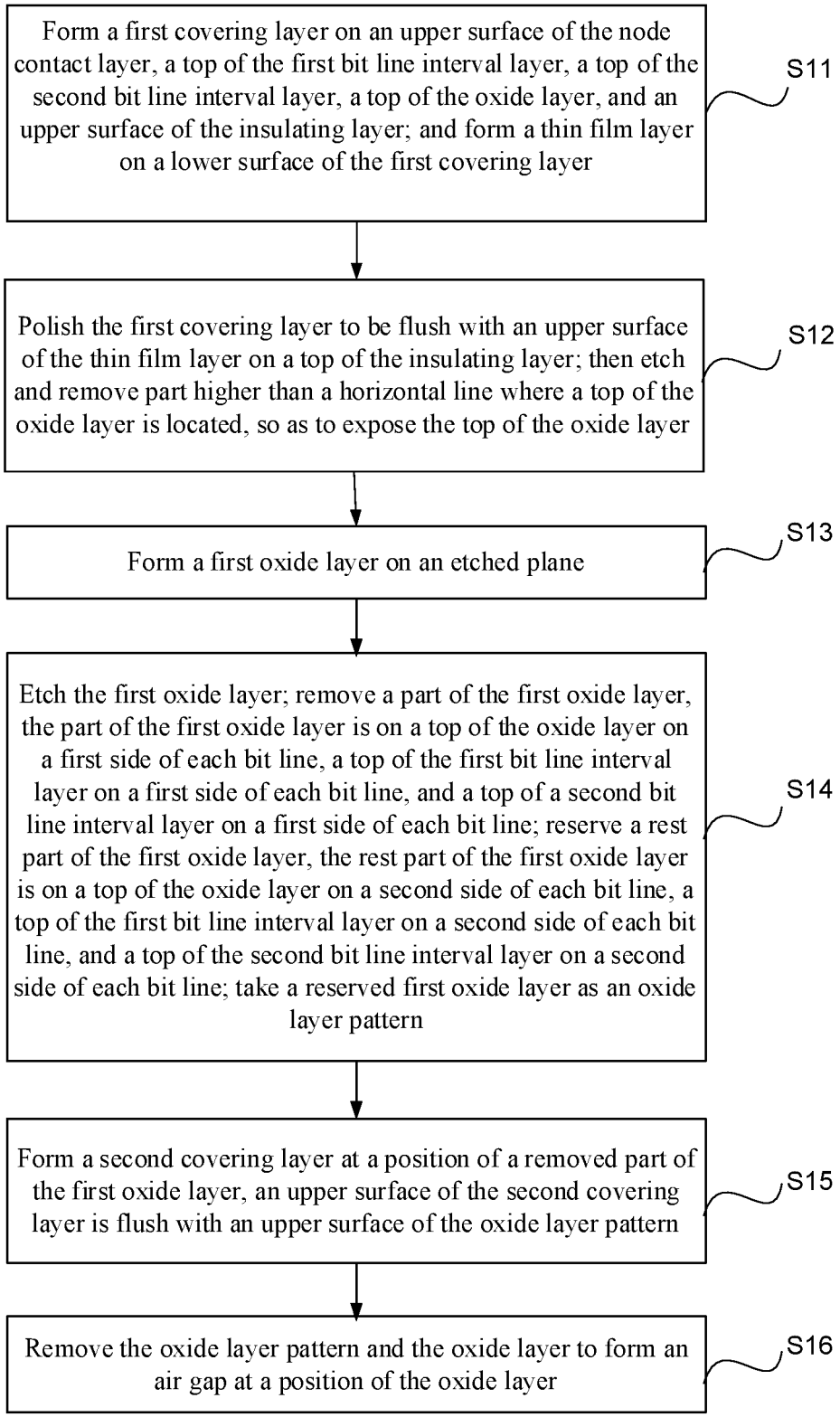
FIG. 3 is a schematic flowchart of the implementation of a method of preparing an air gap provided by the embodiment of the present application.
Figure 4:
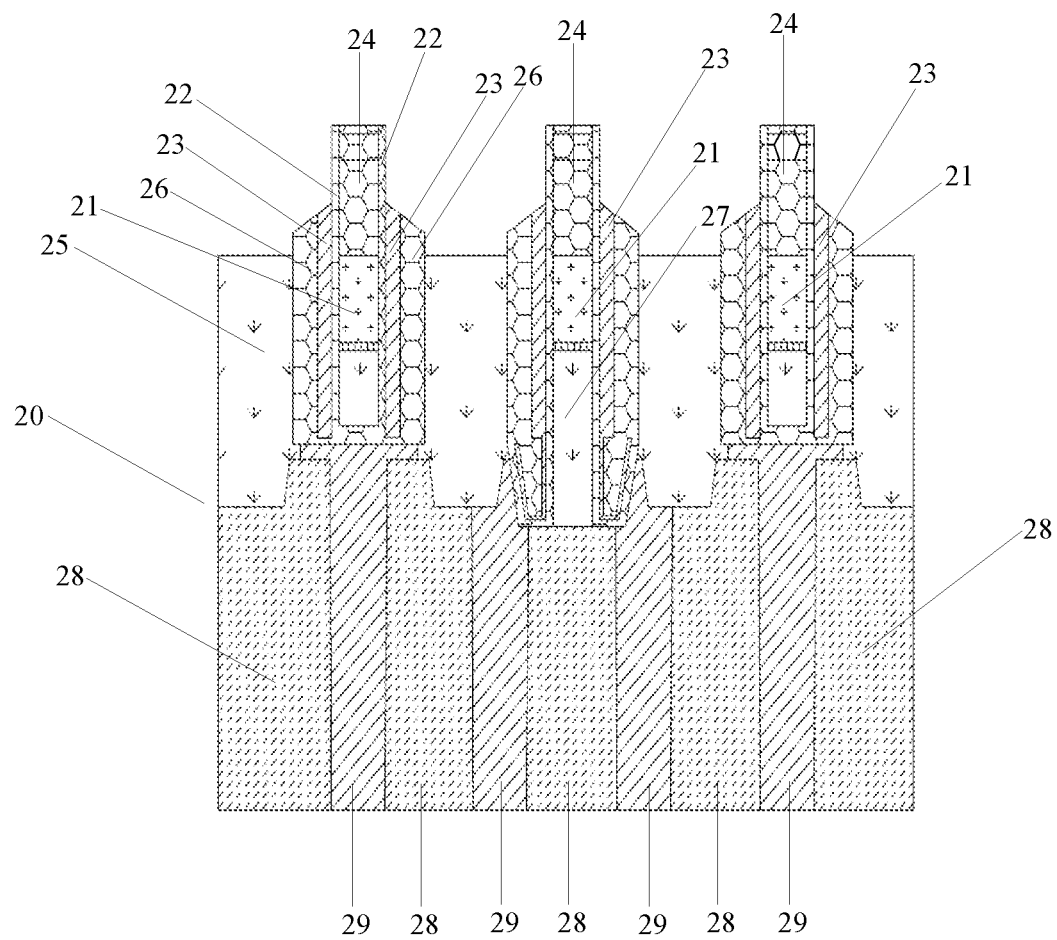
FIG. 4 is a sectional diagram of the initial structure of a dynamic random access memory in an embodiment of the present application.

As shown in FIG. 3, it is a schematic flowchart of the implementation of a method of preparing an air gap provided by the embodiment of the present application, the method of preparing an air gap is applied to dynamic random access memory. In the embodiment of the present application, before the air gap is prepared, the sectional diagram of the initial structure of a dynamic random access memory is shown in FIG. 4. The dynamic random access memory includes: a semiconductor substrate 20 with a bit line 21 and a word line (the word line is not shown in FIG. 4), a first bit line interval layer 22 arranged on both sidewalls of the bit line 21, an oxide layer 23 arranged on the sidewall of the first bit line interval layer 22, and an insulating layer 24 arranged on the top of the bit line 21. A node contact layer 25 is arranged on the surface of the semiconductor substrate 20. The dynamic random access memory further includes a second bit line interval layer 26, and the oxide layer 23 is located between the first bit line interval layer 22 and the second bit line interval layer 26, a bit line contact (BLC) 27 is arranged between the semiconductor substrate 20 and the bit line 21. The semiconductor substrate 20 is provided with an active area (AA) 28, and the semiconductor substrate 20 is also provided with an isolation structure 29 between adjacent active areas 28. The material of the semiconductor substrate 20 can be silicon; the materials of the first bit line interval layer 22 and the second bit line interval layer 26 may be nitride, such as silicon nitride; the material of the oxide layer 23 is oxide, such as silicon oxide. The structure composed of the first bit line interval layer 22, the oxide layer 23, and the second bit line interval layer 26 can be taken as NON structure. The insulating layer 24 is an insulating material for protecting the bit line 21 located thereunder; the node contact layer 25 can realize an electrical connection between the landing pad and the active area 28, and the node contact layer includes polysilicon. The material of the bit line contact 27 is a conductive material for contacting and conducting with the bit line 21; the isolation structure 29 is used for isolating a plurality of active areas 28 in the semiconductor substrate 20.

The method of preparing an air gap may include the following steps:

S11, forming a first covering layer on an upper surface of the node contact layer, a top of the first bit line interval layer, a top of the second bit line interval layer, a top of the oxide layer, and an upper surface of the insulating layer; and forming a thin film layer on a lower surface of the first covering layer.

Figure 5:
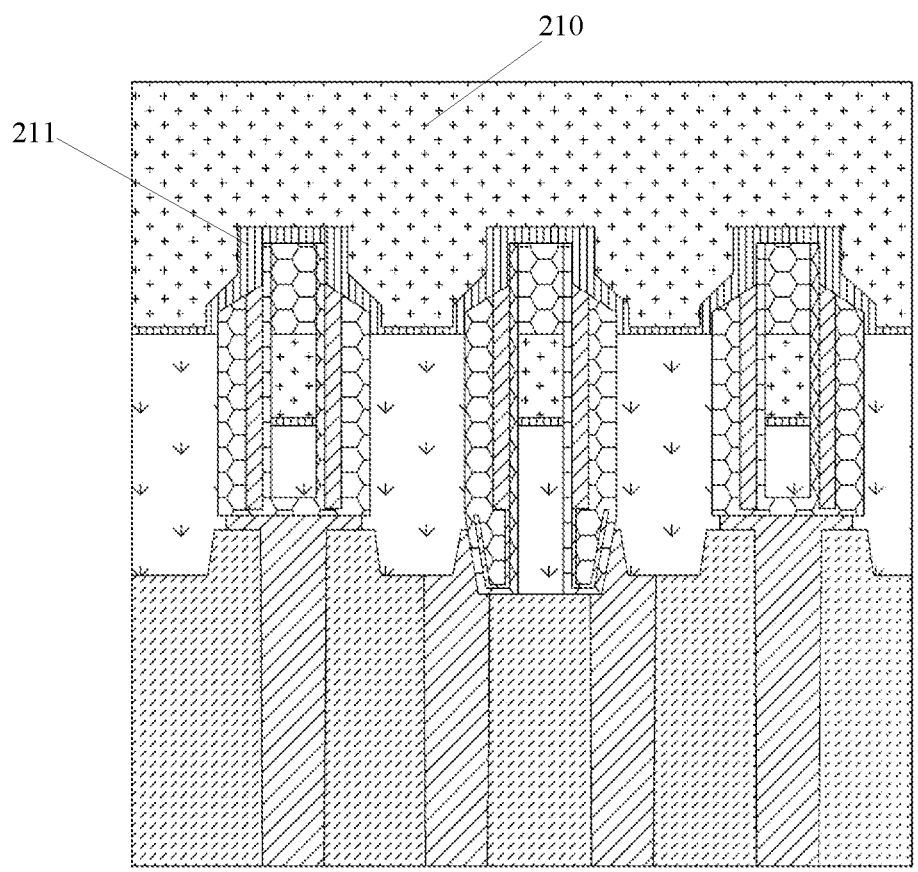
FIG. 5, FIG. 6, FIG. 7, FIG. 8, FIG. 9A, FIG. 9B, FIG. 10 and FIG. 11 are all sectional diagrams of the dynamic random access memory structure corresponding to each step of the method of preparing an air gap according to the embodiment of the present application.

In some embodiments, as shown in FIG. 5, a first covering layer 210 is formed on the upper surface of the node contact layer 25, the top of the first bit line interval layer 22, the top of the second bit line interval layer 26, the top of the oxide layer 23, and the upper surface of the insulating layer 24, the material of the first covering layer 210 can be, but not limited to, metal tungsten. After the deposition is completed, a thin film layer is formed on the lower surface of the first covering layer 210, that is, a thin film layer is formed at the contact surface between the first covering layer 210 and the upper surface of the node contact layer 25, the top of the first bit line interval layer 22, the top of the second bit line interval layer 26, the top of the oxide layer 23, the upper surface of the insulating layer 24; and the thin film layer is a titanium nitride film 211.

S12, polishing the first covering layer to be flush with an upper surface of the thin film layer on a top of the insulating layer; then etching and removing part higher than a horizontal line where a top of the oxide layer is located, so as to expose the top of the oxide layer.

Figure 6:
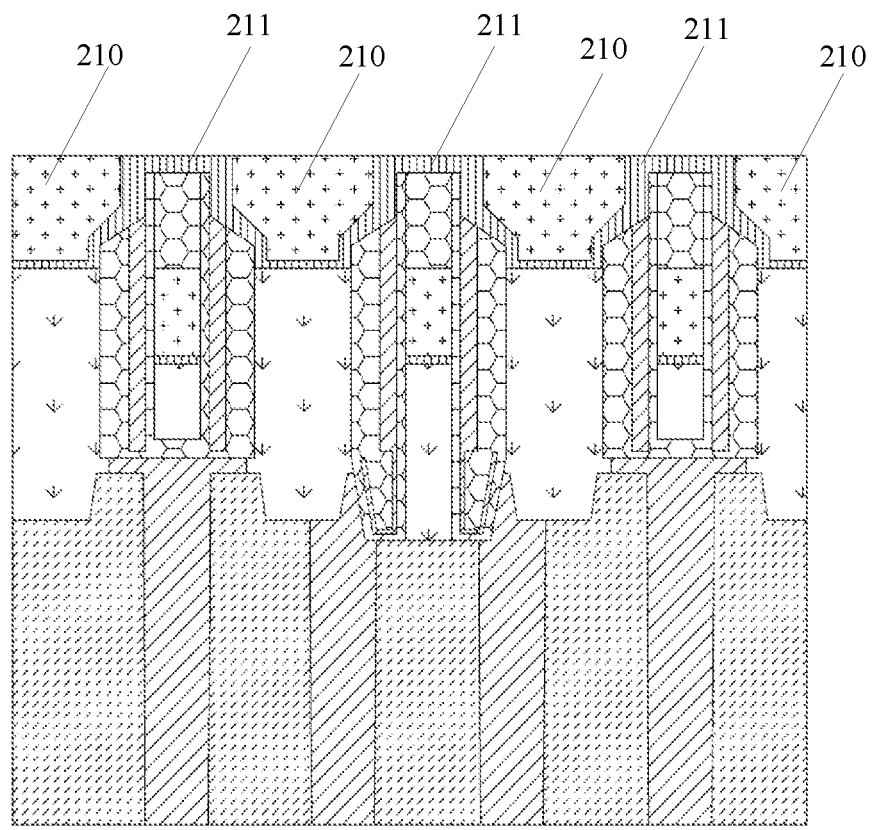
Figure 7:
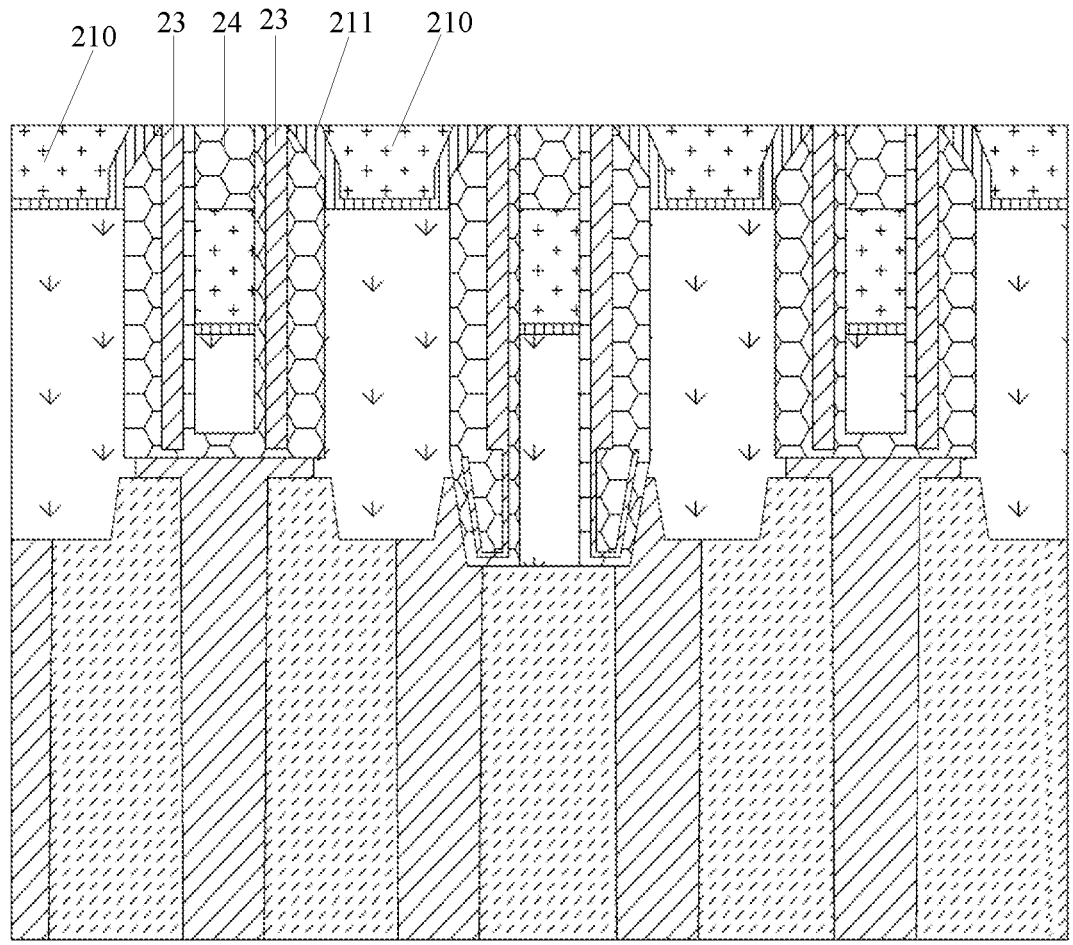

In some embodiments, the first covering layer can be polished from top to bottom to be flush with the upper surface of the titanium nitride film 211 on the top of the insulating layer 24 by a chemical mechanical polish process, The structure after polishing is as shown in FIG. 6. Furthermore, the position of the top of the oxide layer 23 is taken as a horizontal line, and the part higher than the horizontal line is etched and removed; that is, the position of the top of the oxide layer 23 is taken as a horizontal line, the part of the insulating layer 24 higher than the horizontal line, the part of the first covering layer 210 higher than the horizontal line, and the part of the titanium nitride film 211 higher than the horizontal line are removed, so as to expose the top of the oxide layer 23; and the structure after etching is shown in FIG. 7. In this step, the etching process can be performed by, but not limited to, the dry etching process. It can be seen from FIG. 7 that after the etching is completed, the titanium nitride film 211 between the oxide layers 23 on both sides of each bit line 21 is removed, and the titanium nitride film 211 between the adjacent oxide layers 23 on the sidewalls of every two adjacent bit lines 21 is retained.

S13, forming a first oxide layer on the etched plane.

Figure 8:
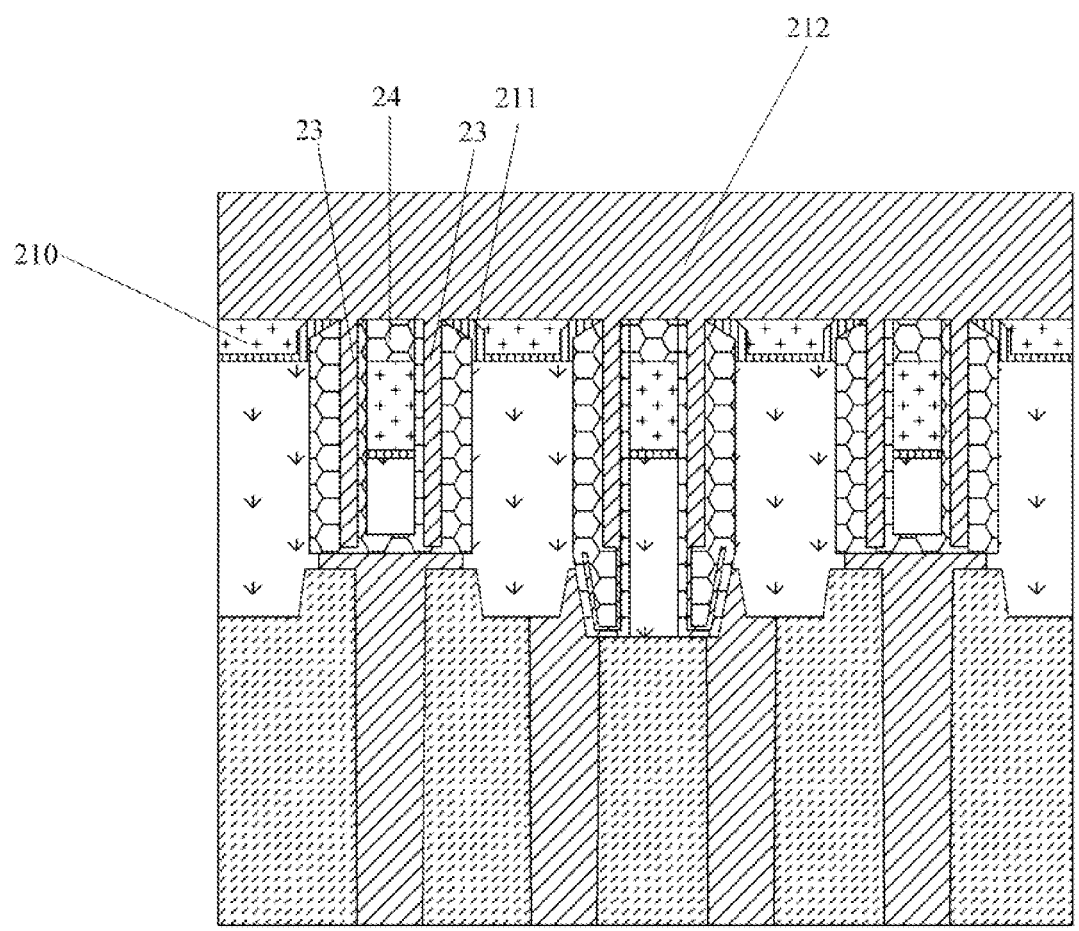

In some embodiments, as shown in FIG. 8, the first oxide layer 212 is formed on the etched plane being exposed. Taking the horizontal line at the top of the oxide layer 23 as a baseline, the first oxide layer 212 is formed at the position higher than the horizontal line; that is, taking the horizontal line at the top of the oxide layer 23 as a baseline, a first oxide layer 212 is formed on the top of the oxide layer 23, the upper surface of the remaining part of the first covering layer 210, the top of the first bit line interval layer 22, the top of the second bit line interval layer 26, the upper surface of the remaining part of the insulating layer 24. In some embodiments of the present application, the material of the first oxide layer 212 is oxide, and the material of the first oxide layer 212 can be the same as the material of the oxide layer 23, such as silicon oxide; the material of the first oxide layer 212 may also be another type of oxide different from the material of the oxide layer 23, which is not limited in the embodiment of the present application.

S14, etching the first oxide layer; removing the part of the first oxide layer on the top of the oxide layer on the first side of each bit line, on the top of the first bit line interval layer on the first side of each bit line, and on the top of a second bit line interval layer on the first side of each bit line; and reserving the rest part of the first oxide layer on the top of the oxide layer on the second side of each bit line, on the top of the first bit line interval layer on the second side of each bit line, and on the top of the second bit line interval layer on the second side of each bit line; taking the reserved first oxide layer as an oxide layer pattern.

Figure 9A:
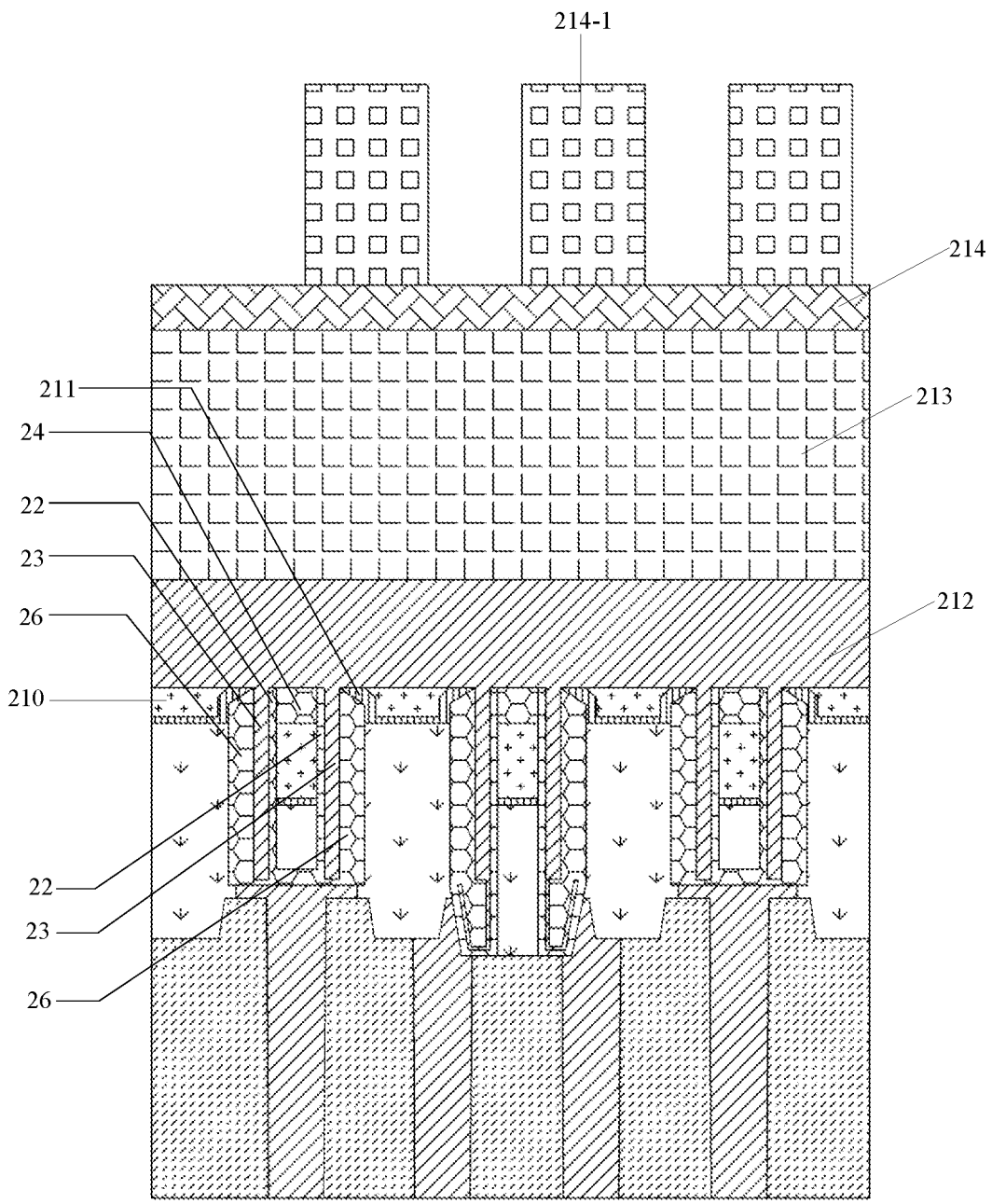

In some embodiments, when the first oxide layer 212 is etched, the etching method is as shown in FIG. 9A. After forming a hard mask (HM) 213 on the upper surface of the first oxide layer 212, a third covering layer 214 is deposited on the upper surface of the hard mask 213, and the target pattern to be etched is exposed by the photoresist 214-1, on the third covering layer 214. Furthermore, the third covering layer 214 and the hard mask 213 are etched by an etching process until the first oxide layer 212 is etched according to the exposed target pattern. The material of the third covering layer 214 may be silicon oxynitride SiON.

Figure 9B:
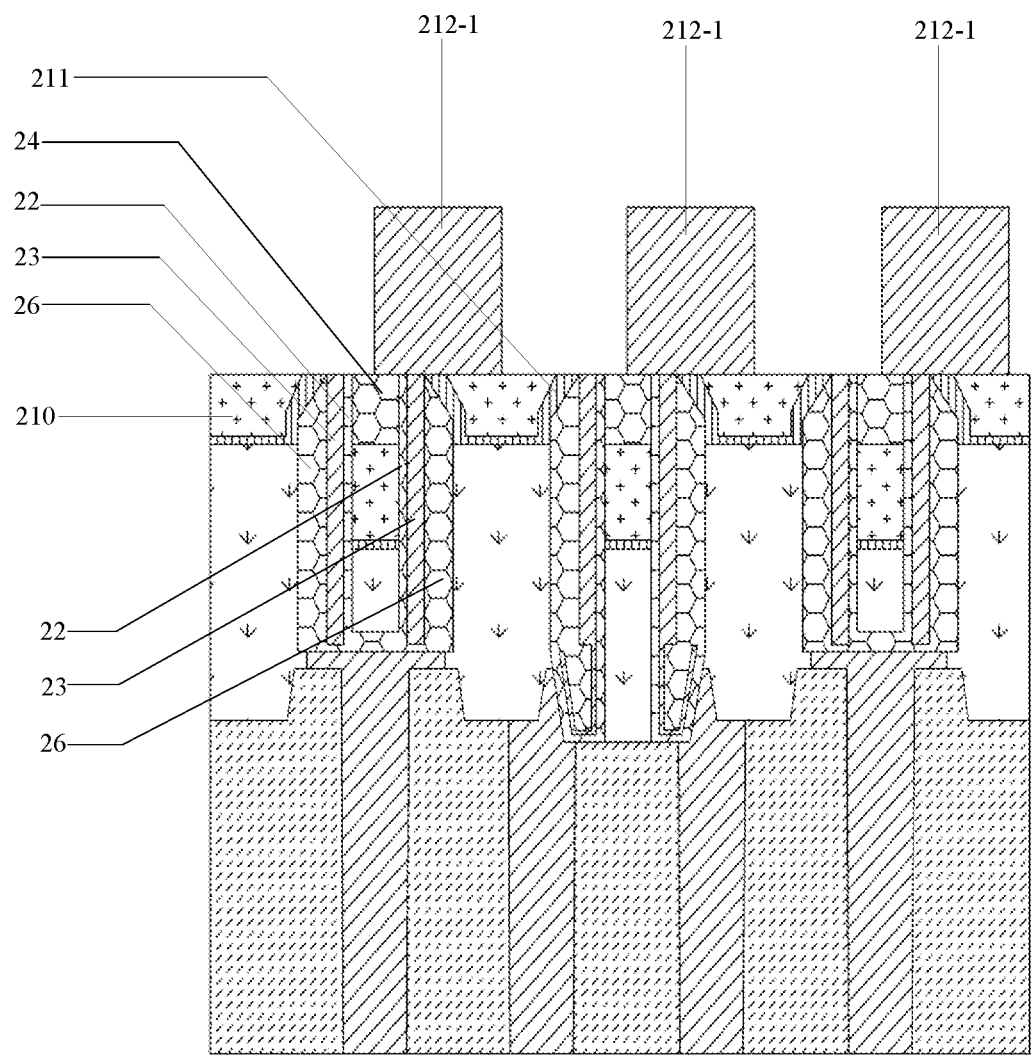

The etching result is shown in FIG. 9B, the part of the first oxide layer 212 on the top of the oxide layer 23 on the first side of each bit line 21, on the top of the first bit line interval layer 22 on the first side of each bit line, and the top of the second bit line interval layer 26 on the first side of each bit line is removed by etching. The rest part of the first oxide layer 212 on the top of the oxide layer 23 on the second side of each bit line 21, on the top of the first bit line interval layer 22 on the second side of each bit line, and on the top of the second bit line interval layer 26 on the second side of each bit line is reserved. That is, for each bit line 21, the first oxide layer 212 on the top of the NON structure (that is, the first bit line interval layer 22, the oxide layer 23, and the second bit line interval layer 26) on one side of the bit line is reserved, to form the oxide layer pattern 212-1, so as to protect the oxide layer 23.

S15, forming a second covering layer at the position of the removed part of the first oxide layer, the upper surface of the second covering layer being flush with the upper surface of the oxide layer pattern.

Figure 10:
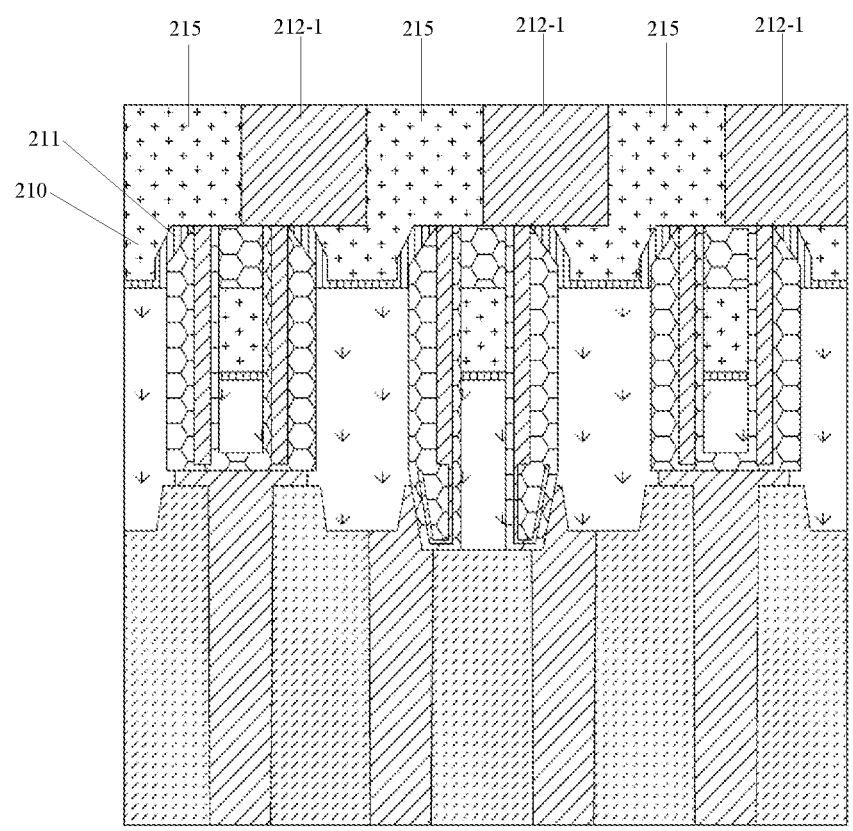

In some embodiments, as shown in FIG. 10, a second covering layer 215 is deposited on the part of the first oxide layer 212 removed in FIG. 9B. The material of the second covering layer 215 can be the same as the material of the first covering layer 210, that is, both can be metallic tungsten. The first covering layer 210 and the second covering layer 215 can be defined as the landing pad.

In some embodiments, the upper surface of the second covering layer 215 can be flush with the upper surface of the oxide layer pattern 212-1 in the following manner:

The upper surface of the second covering layer 215 is polished to the same level as the upper surface of the oxide layer pattern 212-1 by chemical mechanical polish (CMP) process.

S16, removing the oxide layer pattern and the oxide layer to form an air gap at the position of the oxide layer.

Figure 11:
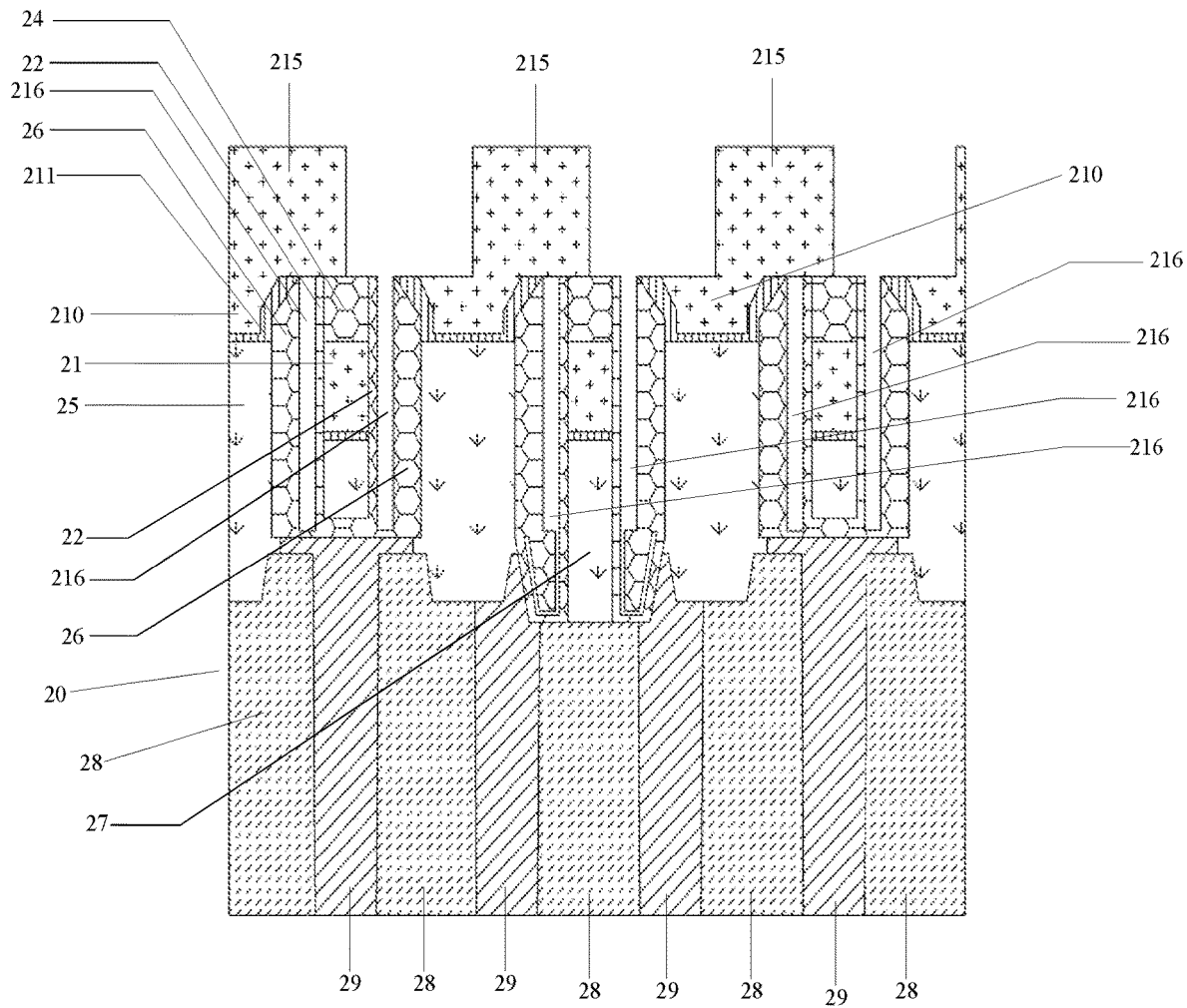

In some embodiments, the oxide layer pattern 212-1 and the oxide layer 23 are etched from top to bottom to remove the oxide layer pattern 212-1 and multiple oxide layers 23. In the implementation process, the oxide layer pattern 212-1 and the oxide layer 23 can be removed by a wet etching process, which is not limited in the embodiment of the present application. As shown in FIG. 11, after the etching is completed, the position of the oxide layer 23 is replaced by an air gap 216, the finally formed structure not only ensures the width of the landing pad necking, but also separates the adjacent landing pads, to avoid the problems of the landing pad bridge and the landing pad necking during the process of preparing the air gap.

An embodiment of the present application provides a method of preparing an air gap, which is applied to a dynamic random access memory. The dynamic random access memory includes: a semiconductor substrate with a bit line and a word line, a first bit line interval layer arranged on both sidewalls of the bit line, an oxide layer arranged on the sidewall of the first bit line interval layer, an insulating layer arranged on the top of the bit line; a node contact layer is arranged on the surface of the semiconductor substrate; the dynamic random access memory further includes a second bit line interval layer, and the oxide layer is located between the first bit line interval layer and the second bit line interval layer. When preparing the air gap, a first covering layer is formed on an upper surface of the node contact layer, a top of the first bit line interval layer, a top of the second bit line interval layer, a top of the oxide layer, and an upper surface of the insulating layer; and a thin film layer is formed on a lower surface of the first covering layer; the first covering layer is polished to be flush with an upper surface of the thin film layer on a top of the insulating layer; then the part higher than a horizontal line is etched and removed, a position of a top of the oxide layer being taken as the horizontal line, so as to expose the top of the oxide layer. Furthermore, a first oxide layer is formed on an etched plane, the first oxide layer is etched; a part of the first oxide layer located on a top of the oxide layer on one side of each bit line is removed, a rest part of the first oxide layer located on a top of the oxide layer on another side of each bit line is reserved, and the reserved part of the first oxide layer is taken as an oxide layer pattern. Furthermore, a second covering layer is formed at a position of a removed part of the first oxide layer, the upper surface of the second covering layer is flush with the upper surface of the oxide layer pattern; the position of the removed part of the first oxide layer is filled with the second covering layer, and the oxide layer pattern and the oxide layer are removed, an air gap is formed at a position of the oxide layer to replace the oxide layer. In some embodiments of the present application, an oxide layer pattern is formed on the top of the first bit line interval layer on one side of the bit line, on the top of the oxide layer on the same one side of the bit line, and on the top of the second bit line interval layer on the same one side of the bit line, and the second covering layer is formed between the oxide layer patterns. The finally formed second covering layer and the finally formed first covering layer are defined as a landing pad. The oxide layer pattern separates the adjacent landing pads, avoiding the problem of short-circuit caused by the landing pad bridge when the air gap is prepared, since the width of the landing pad can be reduced at the same time, the problem of the landing pad necking is avoided Based on the same application concept, an embodiment of the present application also provides a dynamic random access memory, which is a semiconductor structure prepared according to the above-mentioned method of preparing an air gap provided by the embodiment of the present application. As shown in FIG. 11, a sectional diagram of the dynamic random access memory structure is provided.

Based on the same technical concept, an embodiment of the present application also provides an electronic equipment, including the above-mentioned dynamic random access memory provided by the embodiment of the present application.

Obviously, those skilled in the art can make various changes and modifications to the present application without departing from the spirit and scope of the present application. In this way, if these modifications and variations of the present application fall within the scope of the present application and their equivalent technology, the present application is also intended to include these modifications and variations.

What is claimed is:

1. A method of preparing an air gap, being applied to a dynamic random access memory; wherein, the dynamic random access memory comprises: a semiconductor substrate with a bit line and a word line, a first bit line interval layer arranged on both sidewalls of the bit line, an oxide layer arranged on a sidewall of the first bit line interval layer, and an insulating layer arranged on a top of the bit line; a node contact layer is arranged on a surface of the semiconductor substrate; the dynamic random access memory further comprises a second bit line interval layer, and the oxide layer is located between the first bit line interval layer and the second bit line interval layer;

the method of preparing an air gap comprises:
forming a first covering layer on an upper surface of the node contact layer, a top of the first bit line interval layer, a top of the second bit line interval layer, a top of the oxide layer, and an upper surface of the insulating layer; and forming a thin film layer on a lower surface of the first covering layer;

polishing the first covering layer to be flush with an upper surface of the thin film layer on a top of the insulating layer; then etching and removing part higher than a horizontal line where a top of the oxide layer is located, so as to expose the top of the oxide layer;

forming a first oxide layer on an etched plane;

etching the first oxide layer; removing a part of the first oxide layer, the part of the first oxide layer being on a top of the oxide layer on a first side of each bit line, a top of the first bit line interval layer on a first side of each bit line, and a top of a second bit line interval layer on a first side of each bit line; reserving a rest part of the first oxide layer, the rest part of the first oxide layer being on a top of the oxide layer on a second side of each bit line, a top of the first bit line interval layer on a second side of each bit line, and a top of the second bit line interval layer on a second side of each bit line; taking a reserved first oxide layer as an oxide layer pattern;

forming a second covering layer at a position of a removed part of the first oxide layer, an upper surface of the second covering layer being flush with an upper surface of the oxide layer pattern;

removing the oxide layer pattern and the oxide layer to form an air gap at a position of the oxide layer.

2. The method of preparing an air gap according to claim 1, wherein a bit line contact is arranged between the semiconductor substrate and the bit line, and active areas and isolation structures are arranged on the semiconductor substrate, each of the isolation structures is located between adjacent active areas.

3. The method of preparing an air gap according to claim 1, wherein a first covering layer finally formed and a second covering layer finally formed are defined as a landing pad.

4. The method of preparing an air gap according to claim 1, wherein the oxide layer pattern and the oxide layer are removed by a wet etching process.

5. The method of preparing an air gap according to claim 1, wherein etching the first oxide layer, comprises:
forming a hard mask on an upper surface of the first oxide layer, and forming a third covering layer on an upper surface of the hard mask, and then etching the first oxide layer.

6. The method of preparing an air gap according to claim 1, wherein the upper surface of the second covering layer being flush with the upper surface of the oxide layer pattern comprises:
polishing the upper surface of the second covering layer to the same horizontal line as an upper surface of the oxide layer pattern, by a chemical mechanical polish process.

7. The method of preparing an air gap according to claim 1, wherein the first oxide layer and the oxide layer are made of the same material.

8. The method of preparing an air gap according to claim 1, wherein a material of the first oxide layer is silicon oxide.

9. The method of preparing an air gap according to claim 1, wherein a material of the first covering layer and a material of the second covering layer are both tungsten.

10. The method of preparing an air gap according to claim 5, wherein a material of the third covering layer is silicon oxynitride.

11. The method of preparing an air gap according to claim 1, wherein etching from the top of the first covering layer downward and removing part higher than a horizontal line where a top of the oxide layer is located, comprises:
etching from the top of the first covering layer downward and removing part higher than a horizontal line by a dry etching process, a position of a top of the oxide layer is taken as the horizontal line.

12. A dynamic random access memory, wherein the dynamic random access memory is a semiconductor structure manufactured by the method of preparing an air gap according to claim 1.

13. An electronic equipment, comprising a dynamic random access memory according to claim 12.

14. The method of preparing an air gap according to claim 1, wherein etching and removing part higher than a horizontal line where a top of the oxide layer is located, comprises: taking a position of the top of the oxide layer as a horizontal line; removing a part of the insulating layer higher than the horizontal line, a part of the first covering layer higher than the horizontal line, and a part of the titanium nitride film higher than the horizontal line, so as to expose the top of the oxide layer.

15. The method of preparing an air gap according to claim 1, wherein forming a first oxide layer on an etched plane comprises: taking a horizontal line at the top of the oxide layer as a baseline; forming a first oxide layer on the top of the oxide layer, an upper surface of a remaining part of the first covering layer, the top of the first bit line interval layer, the top of the second bit line interval layer, and an upper surface of a remaining part of the insulating layer.

16. The method of preparing an air gap according to claim 5, wherein, on the third covering layer, a target pattern to be etched is exposed by a photoresist; the third covering layer and the hard mask are etched by an etching process until the first oxide layer is etched according to the target pattern.

17. The method of preparing an air gap according to claim 1, wherein, the thin film layer is a titanium nitride film.

18. The method of preparing an air gap according to claim 1, wherein a material of the first bit line interval layer and a material of the second bit line interval layer are both nitride.

19. The method of preparing an air gap according to claim 2, wherein, a material of the bit line contact is a conductive material for contacting and conducting with the bit line.

* * * * *